United States Patent [19]

Jackson

[11] Patent Number: 4,554,536

[45] Date of Patent: Nov. 19, 1985

[54] LOGIC TIMING DIAGRAM DISPLAY APPARATUS

[75] Inventor: Ronald M. Jackson, Portland, Oreg.

[73] Assignee: Tektronix, Inc., Beaverton, Oreg.

[21] Appl. No.: 478,114

[22] Filed: Mar. 23, 1983

[51] Int. Cl.$^4$ ............................................. G06F 3/14
[52] U.S. Cl. .................................. 340/747; 340/721; 340/744
[58] Field of Search ............... 340/720, 721, 732, 733, 340/744, 747, 802, 803, 805; 371/29

[56] References Cited

U.S. PATENT DOCUMENTS 3,968,499 7/1976 Lowe et al. ........................ 340/747
4,364,036 12/1982 Shimizu .............................. 340/720
4,425,643 1/1984 Chapman et al. .................. 340/721

*Primary Examiner*—Gerald L. Brigance
*Assistant Examiner*—Jeffrey A. Brier
*Attorney, Agent, or Firm*—Robert S. Hulse; George T. Noe

[57] ABSTRACT

Apparatus for displaying a logic timing diagram on a raster scan type display device is disclosed. A logic signal is sampled and representations thereof stored in a RAM. The RAM contents are read repeatedly in synchronism with a raster scan operation, and the read-out signal is delayed by a predetermined time which is shorter than one bit cycle of the read-out signal. Logical gating functions, OR, exclusive-OR and NAND gates, receive the delayed and undelayed signals, and provide output signals from which the display of the "High" level, edges and "Low" level of the logic timing diagram are derived. Since it is not necessary to convert the logic signal to display codes and rewrite a display RAM, high speed scrolling and magnification can be obtained quickly and easily.

10 Claims, 2 Drawing Figures

LOGIC TIMING DIAGRAM DISPLAY APPARATUS

BACKGROUND OF THE INVENTION

1. Field of the Invention

The present invention relates generally to a logic timing diagram display apparatus, more specifically to an apparatus for displaying a logic waveform on a raster scan type display device.

2. Description of the Prior Art

A raster scan type display device is frequently used as a display apparatus, since that type of display device has the capability of displaying both timing diagrams and alphanumerics, and is flicker free even when a great deal of information is displayed. Moreover, a raster scan type display device is capable of reversing a monochromic display (black and white) with respect to the entire display or portions of the display, and also blinking all or selected portions of the display.

In a prior logic timing diagram display apparatus having a raster scan type display device such as a CRT, a logic waveform to be displayed on the CRT was considered to be a plurality of segments. All possible kinds of the logic waveform patterns which could occur in one display segment were stored in a waveform (Character) read only memory (ROM). The waveform patterns in the ROM were addressed in accordance with coded signals, referred to as FONT information. When the input logic signal was displayed as the timing diagram on the CRT, the input logic signal was first divided into a plurality of segments and each segment was converted into the appropriate coded signals, i.e., display codes or FONT information. This FONT information was stored in a display Random Access Memory (RAM) in sequential locations corresponding to their occurrence in the input logic signal waveform. The contents (FONT information) of the display RAM were read repeatedly in synchronism with the raster scan operation, and were applied to the address terminals of the waveform ROM for generating the waveform patterns by an intensity control signal. The CRT displayed the logic waveform in response to the intensity control signal and the raster scan operation.

These prior art systems have many disadvantages. One of them is that a large capacity ROM is needed, since all possible kinds of the waveform patterns for the display segment must be stored. A large capacity ROM is expensive. As the number of possible waveform patterns desired to be displayable increased, a much larger capacity was needed for the ROM. Another disadvantage was that the logic signal had to be processed since it had to be converted i.e. broken down into a series of display codes. Thus, it was difficult to display logic waveforms and use high speed horizontal scrolling, since the contents of the display RAM had to be changed in accordance with the scrolling. Moreover, the display RAM had to be rewritten if one wanted to magnify a portion of the currently displayed logic timing waveform.

SUMMARY OF THE INVENTION

According to the preferred embodiment of the present invention, a representation of an input logic signal is stored in a timing data RAM, and the contents thereof are read repeatedly in synchronism with the raster scan display operation. The read-output signal of the logic signal representation from the RAM is delayed by a time period corresponding to one pixel (dot element on the display screen) period, and both the read-output signal and delayed logic signals are applied to a logic gate circuit, wherein the pixel display frequency is higher than the bit frequency of the read-output logic signal. The logic gate circuit includes three logic gates, namely, an OR gate, an exclusive-OR gate and a NAND gate, each of these gates receive as inputs both the non-delayed and delayed representation of the input logic signal. The output signal from the OR gate is used to provide an intensity signal for a top raster line to display a "High" logic level, the output signal from the exclusive-OR gate is used to provide intensity signal for a predetermined number of middle raster lines to display waveform transitions, and the output signal from the NAND gate is the intensity signal for a bottom raster line to display "Low" logic level. These three output intensity signals provided from the logic gate circuit are selected in accordance with a vertical line format, i.e., the OR gate is selected during the top raster line, the exclusive-OR gate is selected during the middle raster lines and the NAND gate is selected during the bottom raster line.

If a plurality of logic signals are displayed simultaneously on the display screen, a single timing diagram may consist of the top, middle and bottom raster lines and two additional blanking raster lines between the logic waveforms displayed. One of the blanking raster lines is positioned above the top raster line and the other one is positioned below the bottom raster line, so that a plurality of displayed logic waveforms can be adequately separated on the display. The displayed logic timing diagram thus displayed can be scrolled horizontally by changing the initial address used in addressing the timing data RAM to provide the read-output signal. Also, the timing diagram displayed can be magnified or reduced horizontally by simply changing the relative frequency of the pixel clock signal to that used to drive the read-output signal. Since it is not necessary to re-write the contents of the RAM for the horizontal scrolling and magnification (or reduction), the timing diagram display can be produced rapidly and easily by a simple circuit construction. It is, therefore, one advantage of the present invention that it provides an improved display apparatus for displaying a logic signal as a timing diagram on a raster scan type display device.

Another advantage is that one can magnify and scroll (horizontally) a displayed timing diagram rapidly and easily. Also, rising and falling edges of a logic waveform can be clearly displayed on a raster scan type display device. Other features and advantages of the preferred embodiment and the present invention will become apparent to those having ordinary skill in the art when taken in conjunction with the accompanying drawings.

DETAILED DESCRIPTION OF THE EMBODIMENT

Figure 1:
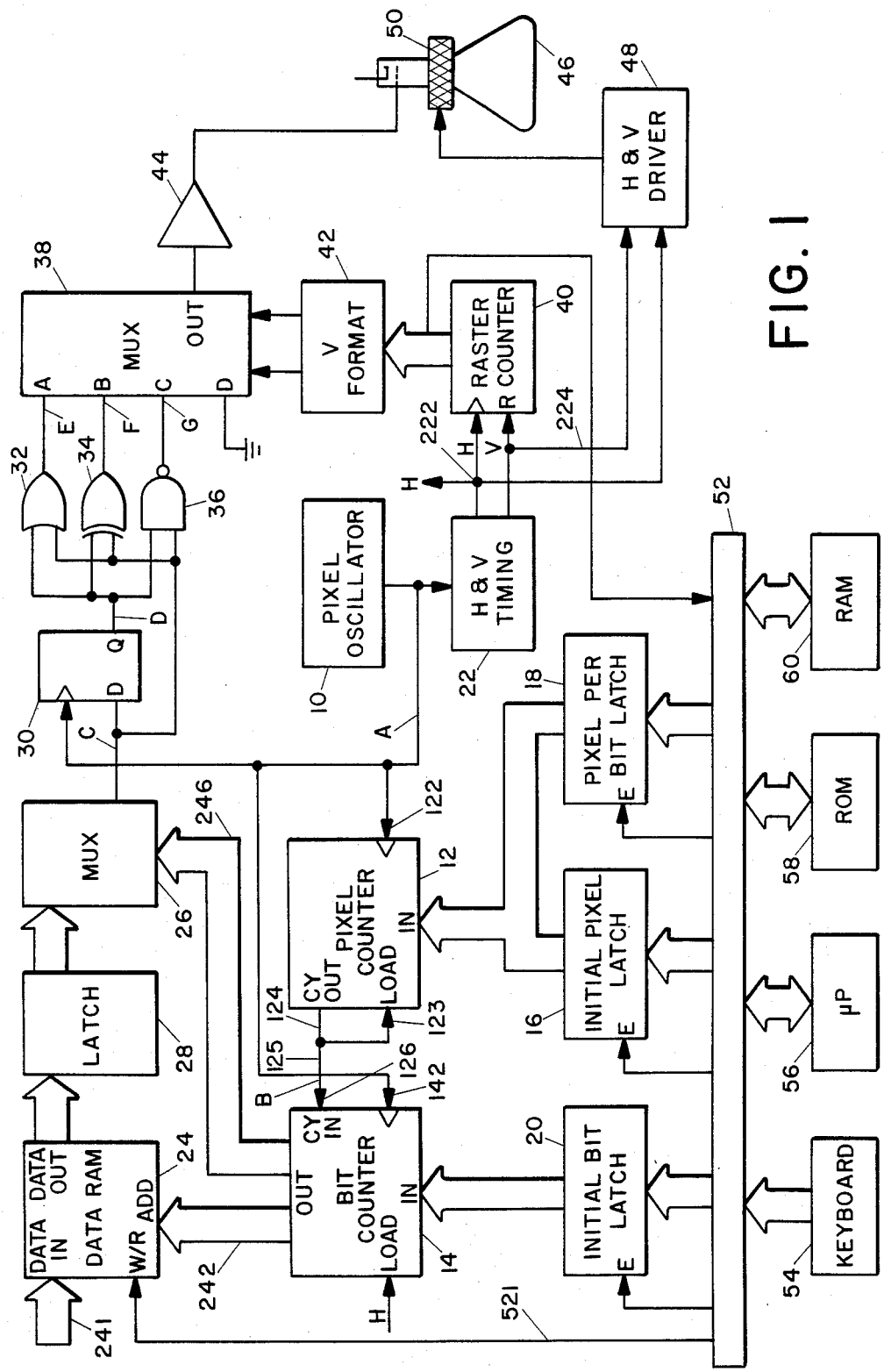
FIG. 1 shows a block diagram of the preferred embodiment in accordance with the present invention.

Referring to FIG. 1, a block diagram of a preferred embodiment according to the present invention is shown. Reference oscillator 10 is a crystal oscillator for generating pixel clock pulses at, for example, 9.8 MHz, and this pixel clock pulse signal is applied to the clock terminals 122 and 142 of pixel counter 12 and bit counter 14, respectively. Pixel counter 12 receives as a preset data value the outputs from initial pixel latch circuit 16 and pixel per bit latch circuit 18, and applies via line 125 the carry output signal (CY OUT) from output 124 of counter 12 to load control terminal 123 of counter 12 and the carry input terminal 126 (CY IN) of bit counter 14. Counter 14 receives as a preset data value the output signal from initial bit latch circuit 20. The loading of the preset data value is controlled by a horizontal timing signal H from horizontal and vertical timing circuit 22 which generates horizontal and vertical timing signals H and V on lines 222 and 224, respectively, in response to the pixel pulse from pixel oscillator 10. The higher order bits of the output signal from counter 14 are supplied via bus 242 to the address terminal (ADD) of timing data RAM 24. The appropriate representation of the logic signal at data input terminal 241 is stored in RAM 24 in response to a write/read (W/R) control signal on line 521. The lower bits of the signal from bit counter 14 are applied via bus 246 to multiplexer 26 which receives the output data from RAM 24 via latch circuit 28. The output signal from multiplexer 26 is applied to a delay device which in the preferred embodiment is D flip-flop 30 clocked by the pixel clock signal thus delaying the signal one pixel period. The delayed signal from the Q terminal of flip-flop 30 and the undelayed signal from multiplexer 26 are applied to a logic gating circuit including OR gate 32, exclusive-OR gate 34 and NAND gate 36, wherein each gate receives both the delayed and undelayed signals.

Raster counter 40 counts the horizontal timing pulse H on line 222 and is reset by the vertical timing pulse V on line 224 and hence the output signal therefrom represents the raster line number. Vertical format circuit 42 generates a two-bit output signal representing the appropriate display code for a longitudinal display area of the raster line corresponding to the logic waveform in response to the output signal from counter 40. Multiplexer 38 selects one of the output signals from gates 32, 34 and 36 or the ground level at input D in response to the output signal from format circuit 42. Format circuit 42 may be a gating or decoding circuit, a memory or a translation table which receives the output signal from counter 40 at the address terminal and generates the two-bit output signal in accordance with a predetermined stored pattern. The output signal from multiplexer 38 is applied through buffer amplifier 44 to the intensity control electrode of a raster scan type display device such as CRT 46. Horizontal and vertical driver 48 receives the horizontal and vertical timing pulses H and V from timing circuit 22, and applies horizontal and vertical ramp signals to yoke 50 of CRT 46 to produce the raster lines.

Latch circuits 16, 18 and 20 may be tri-state latch circuits to receive input signals and enable signals from bus 52. Bus 52 has data, address and control lines. Bus 52 provides a communication path for various purposes, e.g., coupling the write/read control signal to data RAM 24, and raster line information from raster counter 40 to microprocessor 56. Bus 52 is further connected to keyboard 54 as an input device, microprocessor ($\mu$P) 56 (which can be an 8080 or a Z-80 or the like), ROM 58 for storing microprograms for $\mu$P 56, and RAM 60 which is a temporary workspace memory for $\mu$P 56. Blocks 54 through 60 may include other input devices and logic circuits for controlling the display operation.

In the write mode, timing data RAM 24 stores the input logic signal in sequential locations with the values stored therein corresponding to the waveform values.

Figure 2:
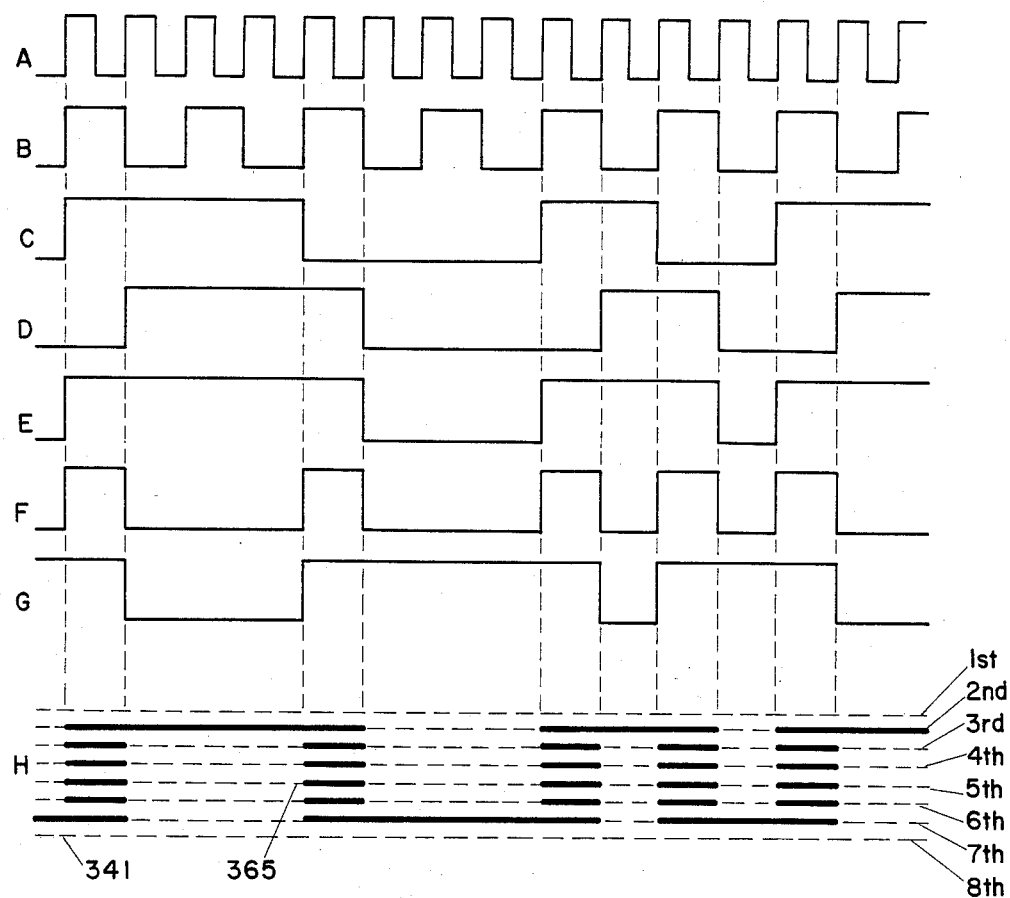
FIG. 2 shows a timing diagram illustrating the operation of the embodiment shown in FIG. 1.

The display mode will be discussed by reference to not only FIG. 1 but also FIG. 2 which shows a time chart of signals in FIG. 1. Latch circuit 18 contains the number of pixels in a bit of the logic signal to be displayed. This number is input from keyboard 54 via bus 52 under control of $\mu$P 56. This number is for purposes of the immediately following example assumed to be two. Since latch circuit 18 is enabled but latch circuit 16 is not enabled, only the output signal (two) from latch circuit 18 is applied to counter 12. Pixel counter 12 acts as a frequency divider which divides the frequency of the pixel pulses on line A by two, and bit counter 14 counts the carry signal B of counter 12 in synchronism with the pixel pulse signal on line A. Pixel counter 12 loads the output signal from latch circuit 18 in response to the carry signal on line B. Latch circuit 20 stores a data value input from keyboard 54 under control of $\mu$P 56. These data values are the initial address of data RAM 24, i.e., the initial portion of the logic signal to be displayed. Bit counter 14 loads the output signal from latch circuit 20 in response to the horizontal timing pulse on line H, and generates the sequence of address signals to RAM 24. Since the logic signal is sampled and stored as, for example, 8-bit digital words in RAM 24, the parallel output signal therefrom is latched by latch circuit 28 and is converted to a serial signal by multiplexer 26. Thus, for the example described, one bit of the output signal on line C from multiplexer 26 corresponds to two periods of the pixel pulse signal on line A.

D flip-flop 30 receives the output signal on line C and the pixel pulse signal on line A at the D and clock terminals, respectively, so that the Q output pulse on line D is delayed by one pixel period with respect to the signal on line C. Gates 32, 34 and 36 generate the pulses on lines E, F and G, respectively, in accordance with their respective logical operation. As described hereinbefore, the display screen of CRT 46 is divided into a plurality of longitudinal display areas each displaying a logic waveform. Each display area consists of, for example, eight raster lines. While the first raster line of the longitudinal display area is scanned, multiplexer 38 selects ground level in accordance with the output signal from format circuit 42, thereby blanking the first raster line as shown in FIG. 2H (the dotted line indicates the blanking operation, i.e., it represents the absence of a display line). In the second raster line, namely, the top line of the timing diagram displayed, multiplexer 38 selects the pulse signal on line E from OR gate 32, and the "High" level portion of the pulse signal on the E is unblanked as appropriate (a continuous solid line in the diagram such as line 341 indicates a line actually displayed). Multiplexer 38 selects the pulse signal on line F from exclusive-OR gate 34 during the third through sixth raster lines. Exclusive-OR gate 34 generates the raising and falling edges of the logic waveform, because gate 34 compares the present pixel bit of the logic signal with the previous pixel bit thereof. It should be noted that the width of the displayed edge is narrower than one bit width of the logic waveform, since the pixel frequency is higher than the bit frequency read out of data RAM 24. In this embodiment, the edge width is one-half of the one waveform bit length, because the contents of latch circuit 18 was selected to be two. While the seventh raster line is scanned, multiplexer 38 selects the pulse signal on line G from NAND gate 36 to display or not display the "Low" level line depending on the signal level of the waveform at the corresponding relative position. The "Low" level line is drawn if the signal level is correspondingly low, otherwise it is blank. The eighth raster line is blanked, because multiplexer 38 selects ground level. As can be understood, the same contents of data RAM 24 are read repeatedly eight times, and thereby completing the display of the logic timing diagram, as shown in FIG. 2. The value selected to be placed in one waveform line of latch 18 will cause a relatively thinner transitional line to be displayed as the value stored in latch 18 increased.

For scrolling the displayed timing diagram horizontally, the contents of latch circuit 20 may be changed (increased or decreased) slightly by a predetermined number. The scrolling speed depends on the changing value and the number of the frames displayed between changing the value. This scrolling is not smooth. However, smooth scrolling is possible by using initial pixel latch circuit 16 for the initial bit of the displayed logic waveform. Variation of the contents of latch circuit 16 can move the display pixel by pixel. In this instance, the contents of latch circuit 16 is changed (increased or decreased) after a predetermined number of occurrences of the frame, and the contents of latch circuit 20 is changed after the contents of latch circuit 16 are changed by a value corresponding to one bit of the logic waveform. The scrolling operations of latch circuit 16 and 20 are controlled by μP 56 for presetting counters 12 and 14 in accordance with the raster line information from raster counter 40, wherein this information is used to determine the timing of the change of data in latches 16 and 20.

The horizontal (time axis) display magnification or reduction can be done by changing the contents of latch circuit 18. If the contents of latch circuit 18 is changed from two to four, the magnification ratio of the logic timing diagram is two. It should be noted that unless the edge width of the displayed logic waveform is changed it will remain unchanged regardless of the magnification ratio. The pixel frequency (line A of FIG. 2) is usually higher than the display bit frequency (line B of FIG. 2) to guarantee that the edge width is narrower than one bit of the displayed waveform.

As can be discerned from the foregoing, the present invention can display a logic timing diagram on a raster scan type display device without using a character (or waveform) ROM and converting an input logic signal to FONT display codes. Since the present invention does not need to convert the input logic signal to FONT codes and rewrite a display RAM to alter the display, it can magnify or scroll the displayed timing diagram rapidly and easily. The edge width of the displayed timing diagram is always narrower than one bit of the logic waveform, so that the timing diagram is displayed clearly even if the level of the logic signal changes for every displayed bit, e.g., a signal which each bit period toggles between high and low logic values.

It will be obvious to those having ordinary skill in the art that many changes may be made in the above-described details of the preferred embodiment of the present invention. For example, gates 32, 34 and 36 may be respectively NOR, exclusive-NOR and AND gate, if the "High" level therefrom corresponds to the blanking. Thus, the OR and NOR gates are called an OR function, the exclusive-OR and excusive-NOR gates are called an exclusive-OR function, and the AND and NAND gates are called an AND function. If data RAM 24 stores a parallel data word, each bit of which corresponds to each display line channel, latch circuit 28 may be deleted. In this instance, the lower order bits of the output from bit counter 14 are applied to the address terminal of RAM 24, and the higher bits are applied to multiplexer 26 to select the logic signal channel. Therefore, the scope of the present invention should be determined only by the following claims.

I claim:

1. A display apparatus for displaying a logic timing diagram on a raster scan type display device, comprising:

memory means for storing representations of a logic signal consisting of digital bits to be displayed, the stored representations of said logic signal in said memory means being read repeatedly in synchronism with the raster scan operation of said display device, wherein a predetermined number of bits are read for each of a plurality of raster lines;

delay means for delaying the logic signal from said memory means by a predetermined time shorter than the time for one bit of the logic signal to be read from said memory means to provide a delayed logic signal; and logic gate means coupled to said memory means and said delay means to receive the logic signal from said memory means and the delayed logic signal from said delay means for generating an intensity control signal comprising blanking levels and turn-on levels for said raster scan device.

2. A display apparatus according to claim 1, wherein said logic gate means includes means for providing OR gate, exclusive-OR gate and AND gate functions to generate turn-on levels of the intensity control signal for displaying "High" level, edges and "Low" level, respectively, of the digital bits of the displayed logic timing diagram.

3. A display apparatus according to claim 2, further including:

selection means coupled to said logic gate means for selecting one of the output signals from said OR gate, exclusive-OR gate and AND gate functions in accordance with the raster line position in the logic timing diagram.

4. A display apparatus according to claim 3, wherein said selection means selects a blanking level of the intensity control signal for an upper raster line above the "High" level raster line and also selects a blanking level of the intensity control signal for a lower raster line below the "Low" level raster line.

5. A display apparatus according to claim 1, wherein said delay means is a D flip-flop with a D terminal to receive the digital bits of the logic signal from said memory means and a clock terminal receive clock pulses, the frequency of said clock pulses being higher than the rate at which the digital bits are read from said memory means.

6. A display apparatus according to claim 5, wherein said clock pulses are generated by a reference oscillator.

7. A display apparatus according to claim 6, further including:

first counter means for counting the clock pulses from said reference oscillator; and second counter means for counting a carry signal from said first counter means, said second counter means generating an address signal for said memory means.

8. A display apparatus according to claim 7, wherein said first counter is preset by a magnification data for magnifying the displayed logic timing diagram in a time axis.

9. A display apparatus according to claim 8, wherein at least one of said first and second counter means is preset by a predetermined data changed sequentially for a horizontal scrolling.

10. A logic timing diagram display apparatus, comprising:

delay means for delaying a logic signal comprising a stream of digital bits by a predetermined time, said logic signal being generated repeatedly;

logic gate means including an OR gate, an exclusive-OR gate and an AND gate each receiving said logic signal and an output signal from said delay means; and raster scan type display means to receive as an intensity control signal output signals from said OR gate, exclusive-OR gate and AND gate selectively in accordance with predetermined ones of a plurality of raster lines.

* * * * *